(12) United States Patent
Kleinschmidt

(10) Patent No.: US 6,898,216 B1
(45) Date of Patent: May 24, 2005

(54) REDUCTION OF LASER SPECKLE IN PHOTOLITHOGRAPHY BY CONTROLLED DISRUPTION OF SPATIAL COHERENCE OF LASER BEAM

(75) Inventor: Jürgen Kleinschmidt, Weissenfels (DE)

(73) Assignee: Lambda Physik AG, Goettingen (DE)

( * ) Notice: Subject to any disclaimer, the term of this patent is extended or adjusted under 35 U.S.C. 154(b) by 0 days.

(21) Appl. No.: 09/574,921

(22) Filed: May 19, 2000

Related U.S. Application Data

(60) Provisional application No. 60/141,678, filed on Jun. 30, 1999, and provisional application No. 60/171,172, filed on Dec. 16, 1999.

(51) Int. Cl.$^7$ ................................................ H01S 3/10
(52) U.S. Cl. ......................... 372/9; 372/29.023; 372/99
(58) Field of Search ........................ 372/9, 99, 29.023

(56) References Cited

U.S. PATENT DOCUMENTS

| | | | |
|---|---|---|---|
| 5,986,824 A | 11/1999 | Mercado | ...................... 359/754 |
| 5,990,926 A | 11/1999 | Mercado | ...................... 347/258 |

FOREIGN PATENT DOCUMENTS

| | | | |
|---|---|---|---|
| DE | 297 22 130 U1 | 5/1998 | ............ G02B/6/20 |
| DE | 198 31 365 A1 | 6/1999 | ............ G02B/6/20 |
| DE | 198 32 277 A1 | 6/1999 | ............ G02B/6/20 |
| WO | WO 99/31536 | 6/1999 | ............ G02B/6/20 |
| WO | WO 99/32912 | 7/1999 | ............ G02B/6/20 |

OTHER PUBLICATIONS

E. Wolf, et al., "Angular Distribution of Radiant Intensity from Sources of Different Degrees of Spatial Coherence," *Optics Communications*, vol. 13, No. 3, Mar. 1975, pp. 205–209.

(Continued)

*Primary Examiner*—Leon Scott, Jr.
(74) *Attorney, Agent, or Firm*—Sierra Patent Group, Ltd.; Andrew V. Smith

(57) ABSTRACT

Speckle of a laser beam is reduced by inserting an anti-speckle apparatus in the beam path to disrupt its spatial coherence while maintaining its temporal coherence. In one embodiment, the anti-speckle apparatus is a phase retarder plate bearing periodic optically-coated regions. Transmission or reflection of the beam through coated and uncoated regions causes an internal phase shift of first beam portions relative to second beam portions, thereby disrupting spatial coherence. Size and thickness of the coated regions can be carefully tailored to meet requirements of stepper and scanner equipment manufacturers for maximum allowable spatial coherence expressed as a minimum permissible number of coherent cells across the beam cross-section. An alternative embodiment of an anti-speckle apparatus is a scattering plate bearing a roughened surface. Transmission or reflection of the beam by the roughened surface disrupts the beam's spatial coherence. The correlation length and/or surface height of structures on the roughened surface of the scattering plate may be adjusted to achieve desired divergency and spatial coherence. A liquid matching medium or solid overcoating may be contacted with the roughened surface to adjust the index of refraction at the interface with the roughened surface. The anti-speckle apparatus may serve to outcouple the laser beam, as well, and a fly eye lens may be positioned after the anti-speckle appartus.

32 Claims, 7 Drawing Sheets

OTHER PUBLICATIONS

W. H. Carter, Coherence and Radiometry with Quasihomogeneous Planar Sources, *J. Opt. Soc. Am.,* vol. 67, No. 6, Jun. 1977, pp. 785–796.

E. Collect, et al., "Is Complete Spatial Coherence Necessary for the Generation of Highly Directional light Beams?," *Optics Letters,* vol. 2, No. 2, Feb. 1978, pp. 27–29.

E. Wolf, "Partially Coherent Sources which Produce the Same Far–Field Intensity Distribution as a Laser," *Optics Communications,* vol. 25, No. 3., Jun. 1978, pp. 293–296.

E. Collect, "New Equivalence Theorems for Planar Sources that Generate the Same Distributions of Radiant Intensity," *J. Opt. Soc. Am.,* vol. 69, No. 7, Jul. 1979, pp. 942–950.

D. L. Jordan, et al., "Experimental Measurements of Non–Gaussian Scattering by a Fractal Diffuser," *Appl. Phys. B.,* vol. B31, No. 3, Jul. 1983, pp. 179–186.

T.S. McKechnie, "Speckle Reduction," *Laser Speckle and Related Phenomena,* 1984, pp. 123–170.

S. Kawata, et al., "Spatial Coherence of KrF Excimer Lasers," *Applied Optics,* vol. 31, No. 3, Jan. 20, 1992, pp. 387–396.

Index of Refraction of Inorganic Liquids, 2 pages.

Lin, Y., et al., "Characterization of Excimer Lasers for Application to Lenslet Array Homogenizers," *Applied Optics,* vol. 40, No. 12, Apr. 20, 2001, pp. 1931–1941.

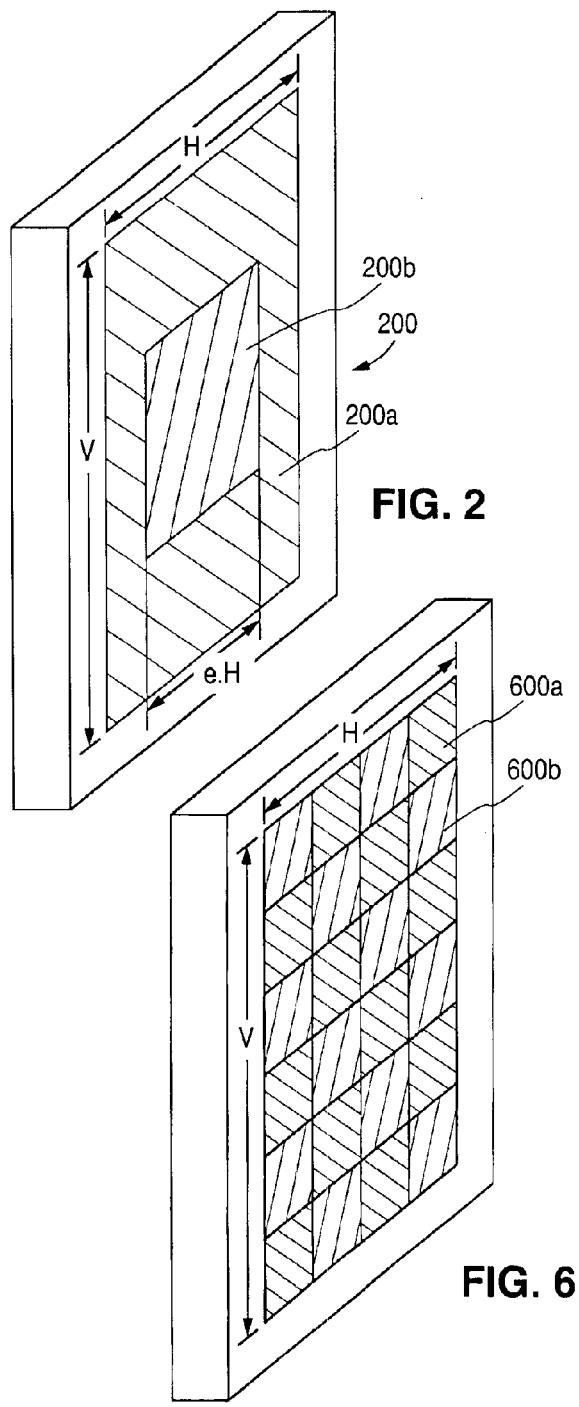

REDUCTION OF LASER SPECKLE IN PHOTOLITHOGRAPHY BY CONTROLLED DISRUPTION OF SPATIAL COHERENCE OF LASER BEAM

PRIORITY

This application claims the benefit of priority to United States Provisional Patent Application nos. 60/141,678 (filed Jun. 30, 1999) and 60/171,172 (filed Dec. 16, 1999).

BACKGROUND OF THE INVENTION

1. Field of the Invention

The invention relates to an apparatus and process for reducing speckle exhibited by a laser beam, and particularly to insertion of an anti-speckle apparatus in the path of a laser beam in order to control the spatial coherence of the beam independent of the construction of the laser resonator.

2. Discussion of the Related Art

Radiation in the deep ultraviolet (DUV, $\lambda > 200$ nm) and vacuum ultraviolet (VUV, $\lambda < 200$ nm) is currently being applied in photolithography to fabricate integrated circuits. Specifically, the output of narrow band ArF and KrF excimer lasers ($\lambda = 193$ nm, 248 nm) are utilized for making semiconductor devices having a feature size of between about 0.18 and 0.25 $\mu$m (produced by radiation from a KrF laser), or between about 0.13 and 0.18 $\mu$m (produced by radiation from a ArF laser). The molecular fluorine laser emitting around 157 nm is also used for forming small structures. EUV sources such as plasma focus sources emitting around, e.g., 13 nm will come into prominence in the future.

Because of the extremely small magnitude of these dimensional ranges and their size relative to the wavelength of the incident laser beam, achromatic imaging optics are difficult to achieve in these wavelength regions. In order to reduce imaging errors caused by chromatic aberration, excimer lasers must produce radiation of an extremely narrow bandwidth ranging between about 0.3 and 0.6 pm. Bandwidth is generally defined as the full width at one-half the maximum of the spectral line shape.

The narrow bandwidths produced by these lasers in turn cause the beam to exhibit a high degree of spatial coherence. Spatial coherence describes coherence exhibited by the light rays of the beam as measured across a beam cross-section. In contrast, temporal coherence describes coherence exhibited by the light rays of the beam over time as the beam traverses a distance.

Unfortunately, high spatial coherence can create problems relating to speckle. Speckle is an interference pattern created by a slight difference in path traveled by the light rays making up the laser beam. Speckle can result from interaction between the beam and minor environmental elements, for example reflection of the beam by slightly turbulent air or by microscopically rough surfaces. Beams exhibiting a high degree of spatial coherence are especially prone to exhibit speckle. Speckle is detrimental to many laser applications because it causes uneven illumination of areas by the beam. Speckle is thus a particularly serious problem in photolithography, where uneven beam illumination can result in non-uniform development of photoresist materials that define the microscopic feature size of active devices.

In photolithography, a laser is generally employed as one component of a larger optical system such as a stepper or scanner. Due in part to concerns about speckle, stepper and scanner manufacturers impose an upper limit on the spatial coherence of lasers eligible for use in their systems. Unfortunately, these spatial coherence requirements vary from manufacturer to manufacturer.

One way to accommodate spatial coherence requirements of equipment manufacturers is to modify the design of the resonator generating the laser beam. However, this approach is impractical for two reasons.

First, the resonator is a complex structure whose performance and output is extremely sensitive to structural changes. Thus, modification of the resonator to conform to the requirements of every manufacturer of a particular optical system would be expensive and time-consuming.

A second problem is that design of the resonator dictates a number of important characteristics of the laser beam apart from bandwidth and spatial coherence. One such characteristic is the spectral purity.

While bandwidth represents the full width at one-half the maximum of the spectral line shape, the spectral purity represents the wavelength interval containing 95% of the pulse energy of the beam. Lasers used in the next lithography generation will emit beams having a spectral purity of less than 1 pm.

Another important beam characteristic is divergency. Divergency describes the angular spreading of the beam cross-section over distance, and is characterized by an angle $\theta$. For beams produced from a resonator utilizing line narrowing elements such as prisms and gratings but without an etalon, beam divergence is dictated solely by the length of the resonator and intracavity apertures. For beams produced from a resonator featuring an etalon, beam divergence is also determined by the properties of the etalon.

To summarize, the line-narrowed lasers employed in photolithography produce radiation exhibiting comparatively small divergency and a high degree of spatial coherence. The character of this radiation is attributable to the particular design of the resonator producing the beam. As a result of the high degree of spatial coherence of the beam, it is prone to exhibit speckle.

Given the problem posed by speckle and the difficulty in modifying the resonator design, there is a need in the art for an apparatus and method permitting precise control over the spatial coherence of a laser beam independent of the design of a particular laser resonator.

SUMMARY OF THE INVENTION

It is an object of the invention to reduce speckle by introducing an anti-speckle apparatus into the path of a laser beam to reduce the spatial coherence of the beam independent of resonator design, while maintaining the temporal coherence of the laser beam substantially unchanged. In one embodiment of the present invention, the anti-speckle apparatus is an optically-coated or holographic phase retarding plate which imposes a phase shift on certain portions of the beam relative to other beam portions upon transmission or reflection. In an alternative embodiment of the present invention, the anti-speckle apparatus is a scattering plate having a roughened surface which causes scattering and reduction in spatial coherence of a laser beam reflected or transmitted by the scattering plate. Both embodiments disrupt the spatial coherence of the beam and thereby reduce speckle independent of the design of the laser resonator, while maintaining the temporal coherence of the laser beam substantially unchanged.

The anti-speckle apparatus in accordance with the present invention is inserted along the beam path of a gas discharge laser such as an excimer or molecular laser. Examples of such lasers are an $F_2$ laser emitting a beam having a $\lambda=157$ nm, a KrF laser emitting a beam having a $\lambda=248$ nm, or an ArF laser having a $\lambda=193$ nm, or XeCl, XeF, or KrCl lasers.

In accord with the above object, a first embodiment of a method for reducing speckle of a laser beam comprises the step of shifting a phase of a first portion of the laser beam relative to a second portion of the laser beam, such that a spatial coherence of the laser beam is disrupted while a temporal coherence of the laser beam is substantially unchanged.

Also in accord with the above object, a second embodiment of a method for reducing speckle of a laser beam comprises the step of scattering a first portion of the laser beam relative to a second portion of the laser beam, such that a spatial coherence of the laser beam is disrupted while a temporal coherence of the laser beam is substantially unchanged.

Further in accord with the above object, a first embodiment of an apparatus for reducing speckle of a laser beam comprises a DUV-VUV transparent substrate bearing a periodic optical coating over a first region, the optical coating causing a phase shift of light transmitted through the first region relative to light transmitted outside of the first region, such that the phase shift generates a desired minimum number of spatially coherent cells in the laser beam.

Still further in accord with the above object, a second embodiment of an apparatus for reducing speckle of a laser beam comprises a DUV-VUV transparent substrate bearing a rough surface having a standard deviation in surface height and a correlation length, the rough surface causing scattering of light transmitted through the substrate to generate a desired minimum number of spatially coherent cells in the laser beam.

Yet still further in accord with the above object, an embodiment of a lithography apparatus in accordance with the present invention comprises an excimer laser configured to generate a laser beam, the excimer laser including a resonator and an outcoupling mirror. The lithography apparatus further comprises a line narrowing apparatus located within the resonator, optics configured to deliver the laser beam to a semiconductor workpiece, and an anti-speckle device located in the path of the laser beam prior to the delivery optics for disrupting the spatial coherence of the laser beam while maintaining a temporal coherence substantially unchanged.

The features and advantages of the present invention will be understood upon consideration of the following detailed description of the preferred embodiment and the accompanying drawings.

BRIEF DESCRIPTION OF THE DRAWINGS

FIG. 2 shows a first embodiment of an anti-speckle apparatus in accordance with the present invention.

FIG. 5 shows an anti-speckle apparatus in accordance with a second embodiment of the present invention.

FIG. 6 shows an anti-speckle apparatus in accordance with a third embodiment of the present invention.

DETAILED DESCRIPTION OF THE PREFERRED EMBODIMENT

The present invention describes reduction in speckle of a laser beam by inserting an anti-speckle apparatus in the path of the beam to disrupt its spatial coherence while maintaining its temporal coherence substantially unchanged. In one embodiment, the anti-speckle apparatus is a phase retarder plate bearing periodic optically-coated regions. Transmission or reflection of the beam through both the coated and uncoated regions causes an internal phase shift of first portions of the beam relative to second portions of the beam, disrupting its spatial coherence. The size and thickness of the coated regions can be carefully tailored to fit the requirements of stepper and scanner equipment manufacturers, in particular the specification for maximum allowable spatial coherence expressed as a minimum permissible number of coherent cells across the beam cross-section.

In an alterative embodiment, the anti-speckle apparatus is a scattering plate bearing a rough surface. Transmission or reflection of the beam by the rough surface degrades the spatial coherence of the beam. The correlation length and/or surface height of structures on the rough surface of the scattering plate may be adjusted in accordance with desired divergency and spatial coherence. In addition, a liquid matching medium or solid overcoating may be contacted with the roughened surface to adjust the index of refraction at the interface with the roughened surface (see German patents DE 297 22 130, DE 198 31 365 and DE 198 32 277, each of which is hereby incorporated by reference).

With either embodiment, insertion of the anti-speckle apparatus in the path of the beam sufficiently disrupts the spatial coherence of the beam to eliminate speckle, without affecting the temporal coherence of the beam.

Figure 1:
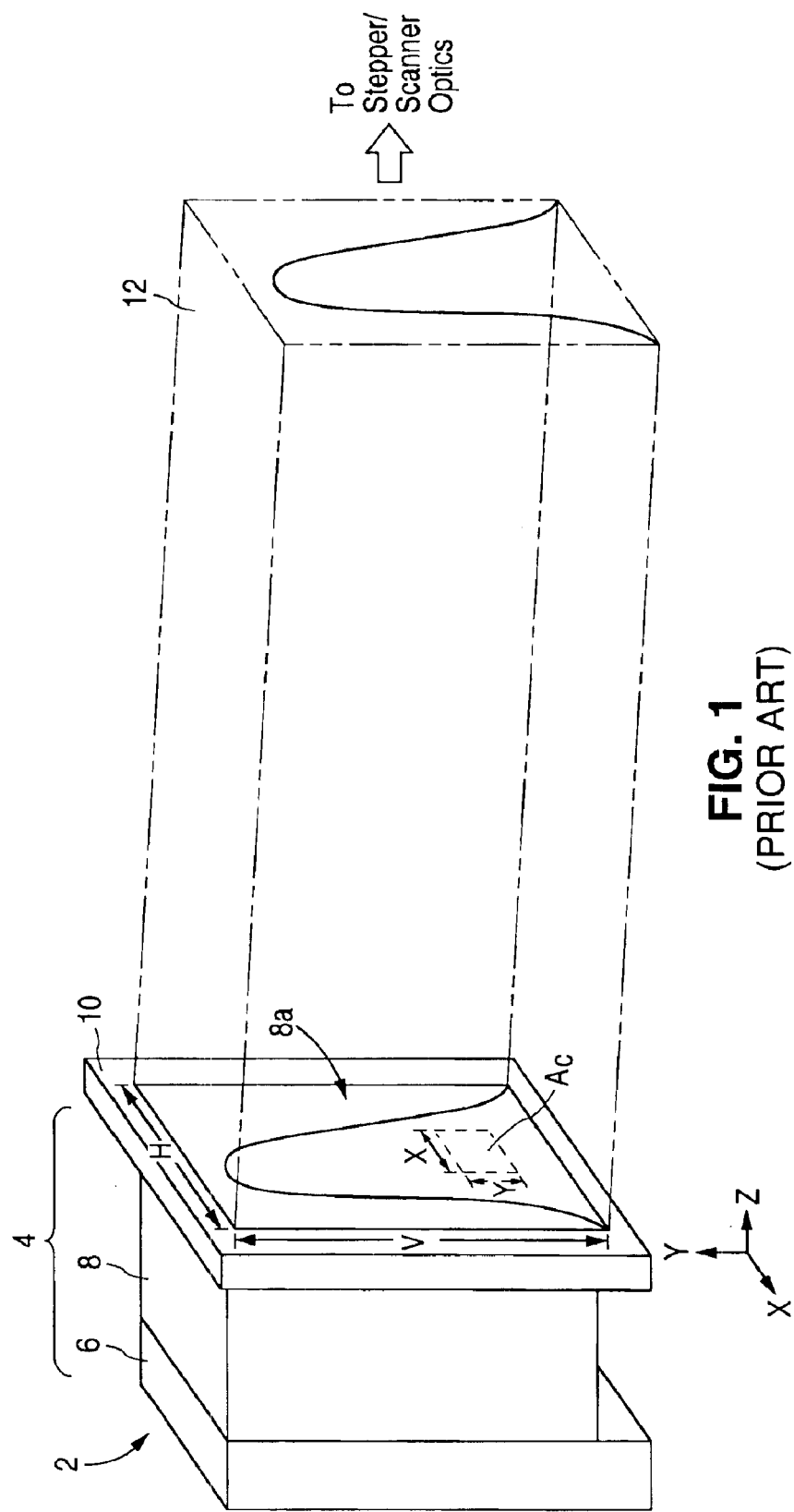
FIG. 1 shows a conventional laser producing a beam having a high degree of spatial coherence.

FIG. 1 shows a conventional laser producing a laser beam possessing a high degree of spatial coherence. Laser 2 features resonator 4 including narrow band unit 6, discharge tube 8, and outcoupling mirror 10.

Depending upon the type and extent of line-narrowing and/or selection and tuning that is desired, and also upon the particular laser that the wavelength selector is to be installed into, many alternative line-narrowing configurations may be used. For this purpose, those shown in U.S. Pat. Nos. 4,399,540, 4,905,243, 5,226,050, 5,559,816, 5,659,419, 5,663,973, 5,761,236, and 5,946,337, and U.S. patent applications Ser. Nos. 09/317,695, 09/130,277, 09/244,554, 09/317,527, 09/073,070, 09/452,353, 60/124,241, 60/140, 532, 60/173,993, 60/140,530, 60/181,156, 60/166,277, and 60/140,531, each of which is assigned to the same assignee as the present application, and U.S. Pat. Nos. 5,095,492, 5,150,370, 4,696,012, 4,972,429, 4,873,692, 5,596,456, 5,844,727, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, and 4,829,536, are each hereby incorporated by reference into the present application. Appropriate selection of one or a combination of the line-narrowing approaches described in the above references may be useful in combination with the phase retarder plate of the invention.

Laser beam 12 exits discharge tube 8 through an aperture having width H and height V, and passes through outcoupling mirror 10. Beam 12 thus has a cross-section of H×V. Laser 2 forms a portion of a larger optical system such as a scanner or stepper, which may include such additional optics as a beam homogenizer.

Because of the design of resonator 4, beam 12 exhibits high spatial coherence in the x-y plane The spatial coherence of beam 12 is quantified in terms of "coherence cells."

The dimension of one separate coherence cell is given by Equation (1) below as:

$$A_C = X_C Y_C \approx \lambda^2 / \theta_X \theta_Y, \text{ where:} \quad (1)$$

$A_C$=area of coherence cell;
X=width of coherence cell;
Y=height of coherence cell;
$\theta_X$=angle of divergency along x-axis; and
$\theta_Y$=angle of divergency along y-axis.

Coherence cell areas $A_C$ are related to a larger number (N) of coherence cells incoherent relative to one other, per Equations (2) and (3) below:

$$N \approx (HV)/A_C, \text{ where} \quad (2)$$

N=total number of coherence cells in the beam;
H=Width of beam cross-section along x-axis;
V=height of beam cross-section along y-axis;
$A_C$=area of each coherence cell; and $$m = H/X_C, n = V/Y_C, N = mn, \quad (3)$$

m=number of coherence cells along the x-axis; and
n=number of coherence cells along the y-axis.

In order to avoid speckle following superposition of the areas of the coherence cells after exposure to optics of the scanner or stepper such as the beam homogenizer, the number N must fulfill the condition $N > N_{min} = m_{min} n_{min}$. The design of the optics of the stepper or scanner imposes a lower limit on divergency, and hence an upper limit on spatial coherence.

It has been proposed to reduce speckle by disrupting spatial coherence of a laser beam. Some of these efforts are summarized by T. S. McKechnie, "Speckle Reduction", in *Topics in Applied Physics, Vol. IX: Laser Speckle and Related Phenomena*, J. C. Dainty, Ed. (1984), pp. 126–132, incorporated herein by reference.

However, the methods of speckle reduction described in this text disrupt temporal coherence in addition to disrupting spatial coherence. For laser beams of fixed pulse length as are currently employed in photolithography, changes in temporal coherence produce a broadening of bandwidth. This broadening of spectral line shape adversely affects the usefulness of the laser in photolithographic applications.

FIG. 2 shows one embodiment of an anti-speckle apparatus in accordance with the present invention. Anti-speckle apparatus 200 is a plate composed of a DUV-VUV transparent material such as fused silica, quartz glass, calcium fluoride ($CaF_2$) or magnesium fluoride ($MgF_2$).

Anti-speckle apparatus 200 further includes an optical coating creating two distinct regions: peripheral region 200a and center region 200b. Peripheral region 200a is uncoated. Coated center region 200b is of width eH, such that light passing through center region 200b experiences a uniform shift in phase relative to light passing through peripheral region 200a. The uniform phase shift imposed by center region 200b is determined by the thickness of the coating over this region. Specifically, the imposed phase shift would be $2\pi(nd\backslash\lambda)$, where d is the thickness of the coating, n is the refractive index of the coating, and $\lambda$ is the wavelength of the incident light. While silicon dioxide and silicon nitride are two possible coatings, a large number of other materials are candidates for forming the optical coating. For this reason, the $79^{th}$ Edition (1998–1999) of the Handbook of Chemistry and Physics is hereby incorporated by reference, including lists of the refractive index of organic, inorganic, semiconductor, mineral, and glass materials.

Figure 3A:
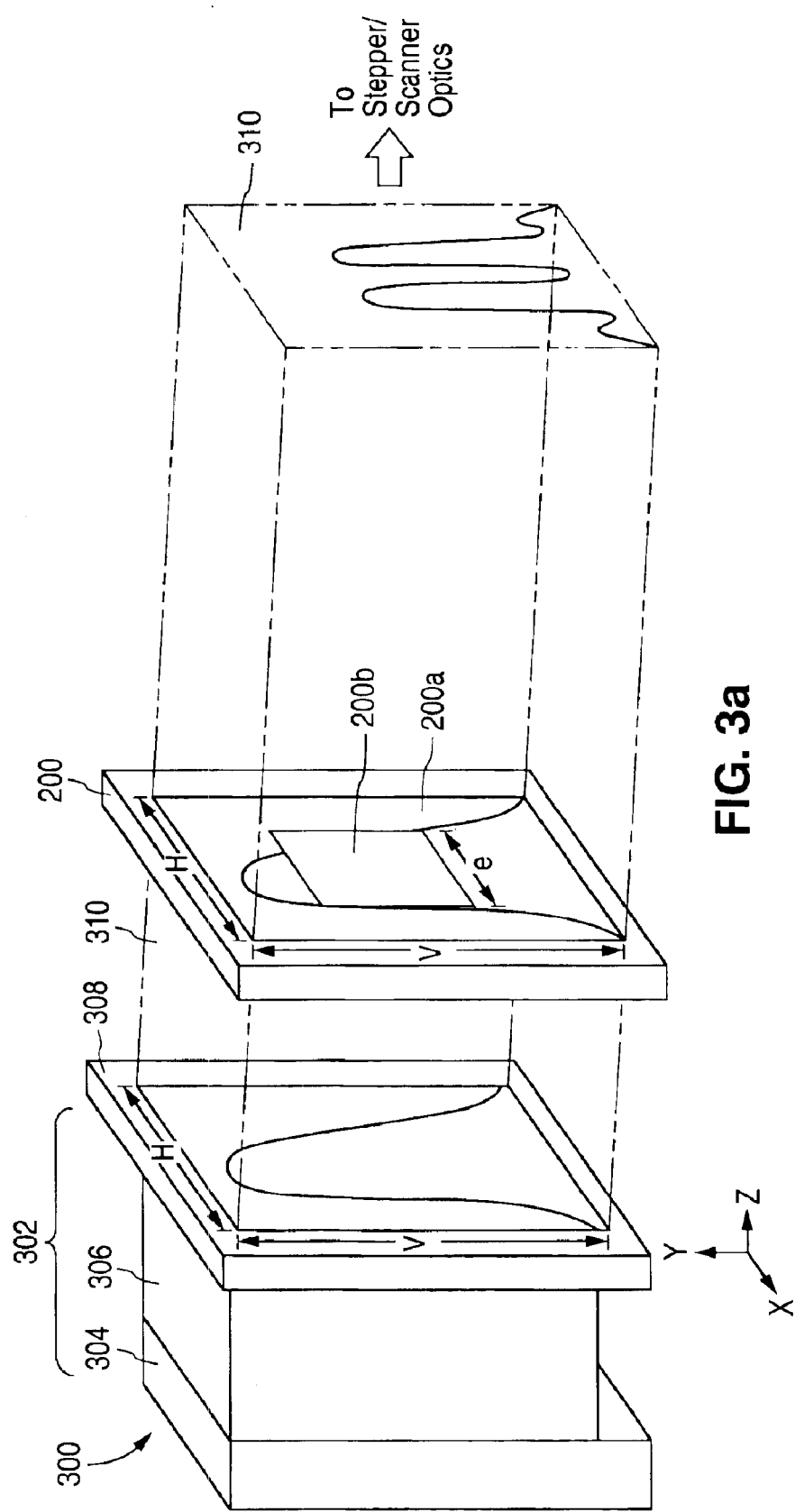
FIG. 3a shows a first laser embodiment employing an anti-speckle apparatus.

FIG. 3a shows a first embodiment of a laser employing an anti-speckle apparatus in accordance with the present invention. Laser 300 includes resonator 302 including narrow band unit 304, discharge tube 306, and outcoupling mirror 308. Preferred gas mixtures and methods of stabilizing gas mixtures of these excimer lasers and other lasers such as the XeF, XeCl, KrCl excimer lasers, as well as the molecular fluorine laser, are described at: U.S. Pat. Nos. 4,393,505, 4,977,573 and 5,396,514, and U.S. patent applications Ser. Nos. 09/317,526, 09/418,052, 09/513,025, 60/137,907, 09/379,034, 60/160,126 and 60/124,785, each of which is assigned to the same assignee as the present application.

Laser beam 310 of fixed pulse length exits discharge tube 306 through an aperture having width H and height V, and passes through outcoupling mirror 308. At the time of passing through outcoupling mirror 308, beam 310 exhibits a high degree of spatial coherence in the x-y plane.

However, laser 300 further includes anti-speckle apparatus 200, an example of which is shown and described with respect to FIG. 2. Anti-speckle apparatus 200 is shown placed in the path of beam 310 exiting from outcoupling mirror 308. Alternatively, the apparatus 200 may also function as the outcoupling mirror of the laser 300. Beam 310 passes through anti-speckle apparatus 200 symmetrically with respect to center region 200b and peripheral region 200a. As a result of passing through phase retarder apparatus 200, the center of beam 310 passing through center plate portion 200b is uniformly shifted in phase relative to the surrounding beam cross-section. This phase shift disrupts the spatial coherence of beam 310 and thereby reduces speckle, without substantially affecting the temporal coherence of the laser.

Figure 3B:
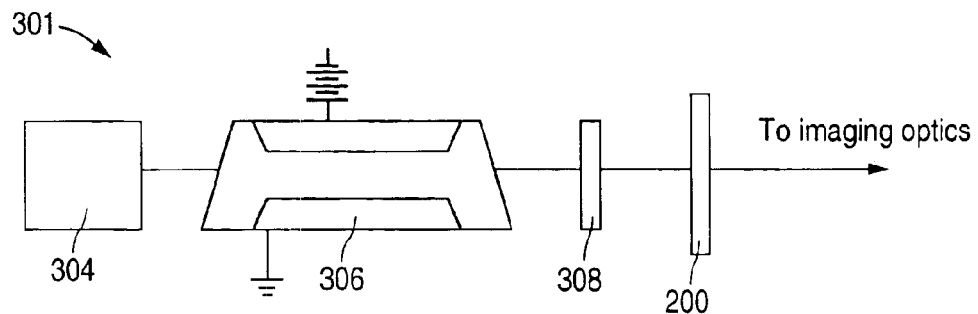
FIG. 3b shows a second laser embodiment employing an anti-speckle apparatus.

FIG. 3b shows a second laser embodiment employing an anti-speckle apparatus. As shown, the laser system 301 includes a line-narrowing unit 304, which may be in accord with any of the line-narrowing units described in any of the patents or patent applications mentioned above, or another line-narrowing unit employing one or more of a trasnmission or reflection grating, one or more beam expanding and/or dispersive prisms, one or more etalons, a grism, etc., including line-narrowing optics known to those skilled in the art. The laser 301 also includes a gas discharge chamber 306 having a pair of main electrodes, and preferably one or more preionization electrodes, connected to a power supply circuit, wherein preferred electrical setups include those set forth at U.S. patent applications Ser. Nos. 09/090,989, 09/136,353, 60/120,218, 09/247,887, 60/162,845, 09/317, 695, 09/130,277, 09/172,805, 09/379,034, 09/244,554, 09/317,527, 09/327,526, 09/447,882, 60/162,845, 09/453, 670, 60/122,145, 60/198,058, 60/140,531, 60/166,952, 60/173,993, 60/166,277 and 60/140,530, each of which is assigned to the same assignee, and U.S. Pat. Nos. 6,005,880, 6,020,723, 5,337,330, 5,729,562, 5,914,974, 5,936,988, 5,818,865 and 6,002,697, all of which are hereby incorporated by reference. The output coupler transmits a beam 310 which thereafter traverses the anti-speckle plate 200 before reaching the imaging optics.

Figure 3C:
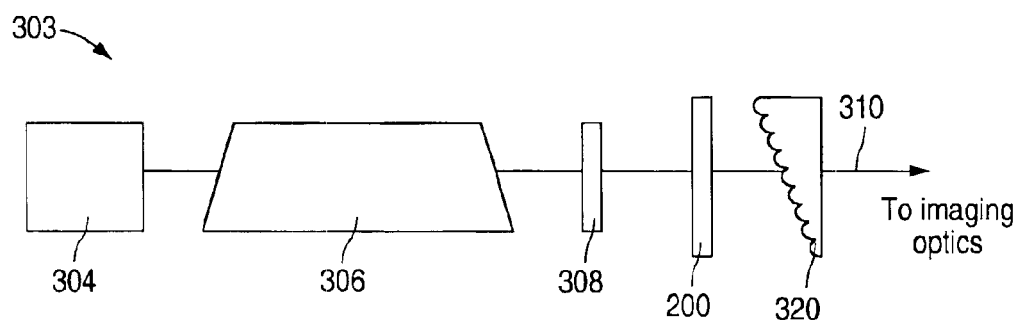
FIG. 3c shows a third laser embodiment employing an anti-speckle apparatus before a fly eye lens.

FIG. 3c shows a third laser embodiment 303 employing an anti-speckle apparatus 200 before a fly eye lens 320. The third laser embodiment is the same as that shown in FIG. 3b, except for the fly eye lens 320. The fly eye lens 320 is preferably of conventional type, such as may include a row of refractive elements positioned along an axis of the beam having different optical lengths. For example, the fly eye lens may include elements of the same refractive material (and having the same refractive index), but having different geometric lengths, or the elements may have different refractive indices and same geometric lengths, or both. One skilled in the art would know various forms of conventional fly eye lenses and any of these may be used with the third embodiment. The fly eye lens 320 works in combination with the plate 308 to reduce speckle in the beam. The beam 310 propagates further after the fly eye lens 320 to imaging optics.

Figure 3D:
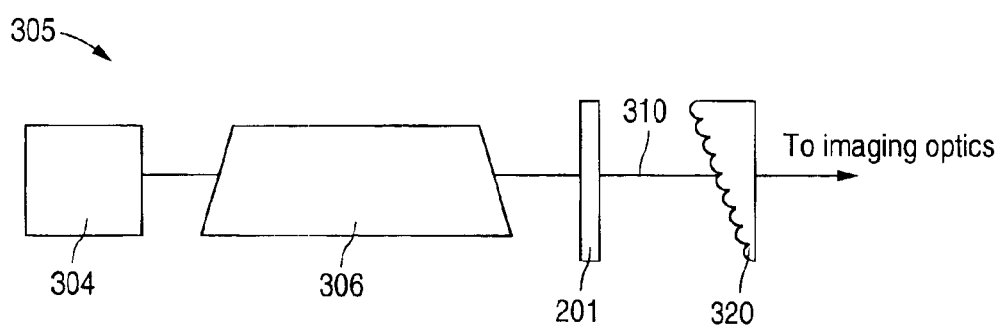
FIG. 3d shows a fourth laser embodiment employing an anti-speckle apparatus as an output coupler.
Figure 4A:
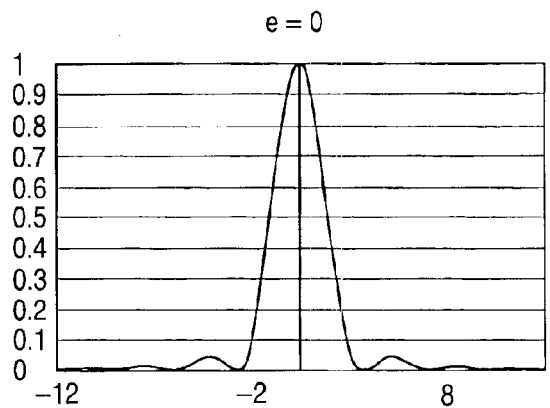
FIGS. 4a–4d show the calculated far field intensity distribution of the laser beam produced by the laser of FIG. 3.
Figure 4B:
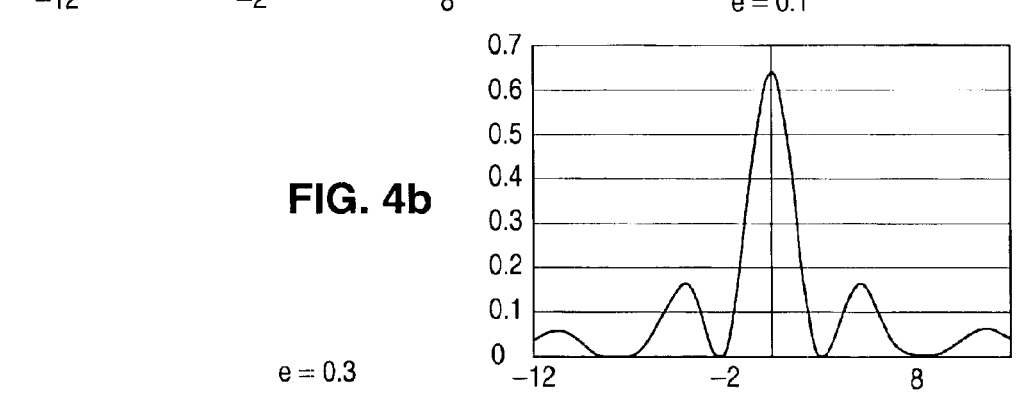
Figure 4C:
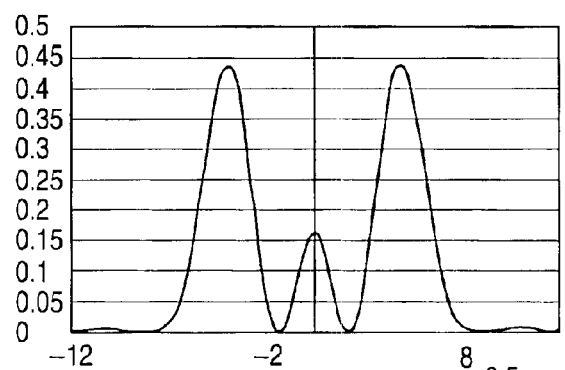
Figure 4D:
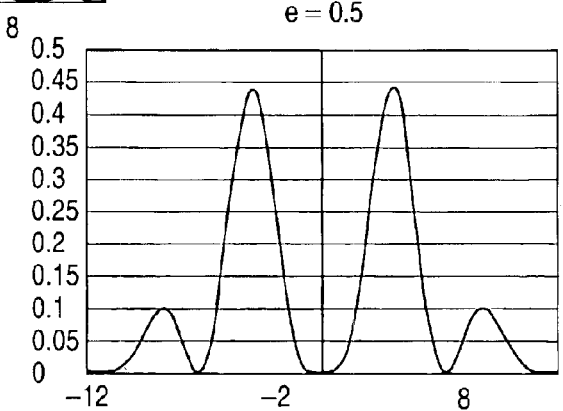

FIG. 3d shows a fourth laser embodiment 305 employing an anti-speckle apparatus 201 as an output coupler. In this way, the antispeckle apparatus 201 also has the reflectivity of a typical output coupler of an excimer or molecular fluorine laser and transmits the output beam 310. The plate 201 may be two plates such as produce etalonning in the system, as well. The plate may serves to dispersively linenarrow, such as being formed to disperse the beam as a prism or transmission grating or grism would, in addition to reducing the speckle and/or output coupling the beam. The fly eye lens 320 is shown in FIG. 3d, but may be taken out, as desired.

FIGS. 4A–4D show the calculated far field intensity distribution along the x-axis only, of beam 310 after it has passed through a anti-speckle apparatus 200 of FIG. 2 exhibiting a fixed phase shift of $\pi$ and having center region 200b of various widths eH. Beam intensities are shown for phase retarding apparatuses where e varies from e=0, 0.1, 0.3, and 0.5.

As shown in FIGS. 4A–4D, as the width eH increases, the angular distribution vanishes as $\theta_X$ approaches zero. This results in a three-fold increase in beam divergency between e=0 and e=0.5. The anti-speckle apparatus 200 thus changes the divergency of beam 310 without any corresponding loss in beam power.

FIG. 5 shows a second embodiment of an anti-speckle apparatus in accordance with the present invention. The beam of a narrow band excimer laser possesses coherent cells with dimensions of between about 0.3 mm and 0.5 mm. Accordingly, the fused silica plate 500 of the anti-speckle apparatus in accordance with the second embodiment of the present invention bears a periodic optical coating, with each coated region 500a having an area of about 0.15–0.25 mm². The thickness of the coating 500 determines the shift in phase of light passing through plate 500 (for example a phase shift of $\pi$).

The spatial periodicity of the coated regions in x- and y-direction determines the minimum divergences of the beam behind the plate. The number and density of coated regions per area unit can be tailored to conform to the requirements of a given system manufacturer for the minimum number of coherent cells $N_{min}=m_{min}n_{min}$ over the beam cross section A=H*V. The phase shift may have any random value in the interval 0 . . . $2\pi$.

It is important to note that where the plate has a coated structure with a fixed period (a phase grating with the same grating constant over the entire plate), the area of each coated region should be slightly different to other coated regions, and the distances between the coated regions should vary somewhat around a mean value. This is because light encountering a precisely uniform grating pattern will exhibit a far field intensity distribution which includes a periodic intensity pattern. In order to obtain a smoothed far field intensity distribution preferred by stepper manufacturers without additional modulation, the grating constant is preferably statistically distributed around a mean value, and/or the phase shifts are statistically distributed in the interval 0 . . . $2\pi$.

FIG. 6 shows a third embodiment of an antispeckle apparatus in accordance with the present invention. Phase retarder plate 600 includes alternating regions 600a and 600b bearing different optical coatings that cause a relative shift in the phase of beam portions passing through these coated regions.

The embodiments of anti-speckle apparatuses described in conjunction with FIGS. 2, 5, and 6 are most advantageously used with a pulsed semi-narrow band excimer laser such as a KrF or ArF excimer laser having a characteristic bandwidth in excess of 200 pm, and an output beam narrowed to under 100 pm, typically using a dispersive prism. Other lasers such as the molecular fluorine laser could also benefit from the present invention.

In addition, these embodiments are most advantageously used in a photolithographic system including a catadioptric or all-reflective imaging system. Acceptable input laser emission bandwidths for catadioptric imaging systems are between about 15–100 pm at 248 nm, and between about 5–40 pm at 193 nm.

The embodiments described above can also be used with imaging systems including all-refractive optics. For imaging systems using all-refractive optics, acceptable input laser emission bandwidths are between about 0.4–0.8 pm and between about 0.3–0.7 pm, respectively, when KrF and ArF laser input radiation sources are used. For example, an $F_2$-laser having an output beam linewidth of less than 1 pm may benefit in accord with the present invention, even though all-refractive optics are used for imaging the radiation onto the lithographic mask or reticle.

The embodiments described above can also be used in imaging systems that include etalons for control over line narrowing. However, where etalons are employed in the resonator, their contribution to beam divergence must be considered in determining the changed spatial coherence necessary to reduce speckle.

Although an anti-speckle apparatus in accordance with the present invention has so far been described in connection with three specific embodiments, the present invention is not limited to these embodiments. Various modifications and alterations in the structure and method will be apparent to those skilled in the art without departing from the scope of the present invention.

For example, while the anti-speckle apparatus in accordance with the embodiment of the present invention depicted in FIG. 3 utilizes transmission of the laser beam through an optically coated region, this is not required by the present invention. A reflective-type phase retarder plate bearing a periodic optical coating over a reflective substrate could also be employed to reduce speckle and fall within the scope of the present invention. Moreover, such a reflective-type phase retarder plate could itself serve as an outcoupling mirror at the end of a discharge tube of the laser resonator and still remain within the scope of the present application.

Figure 7:
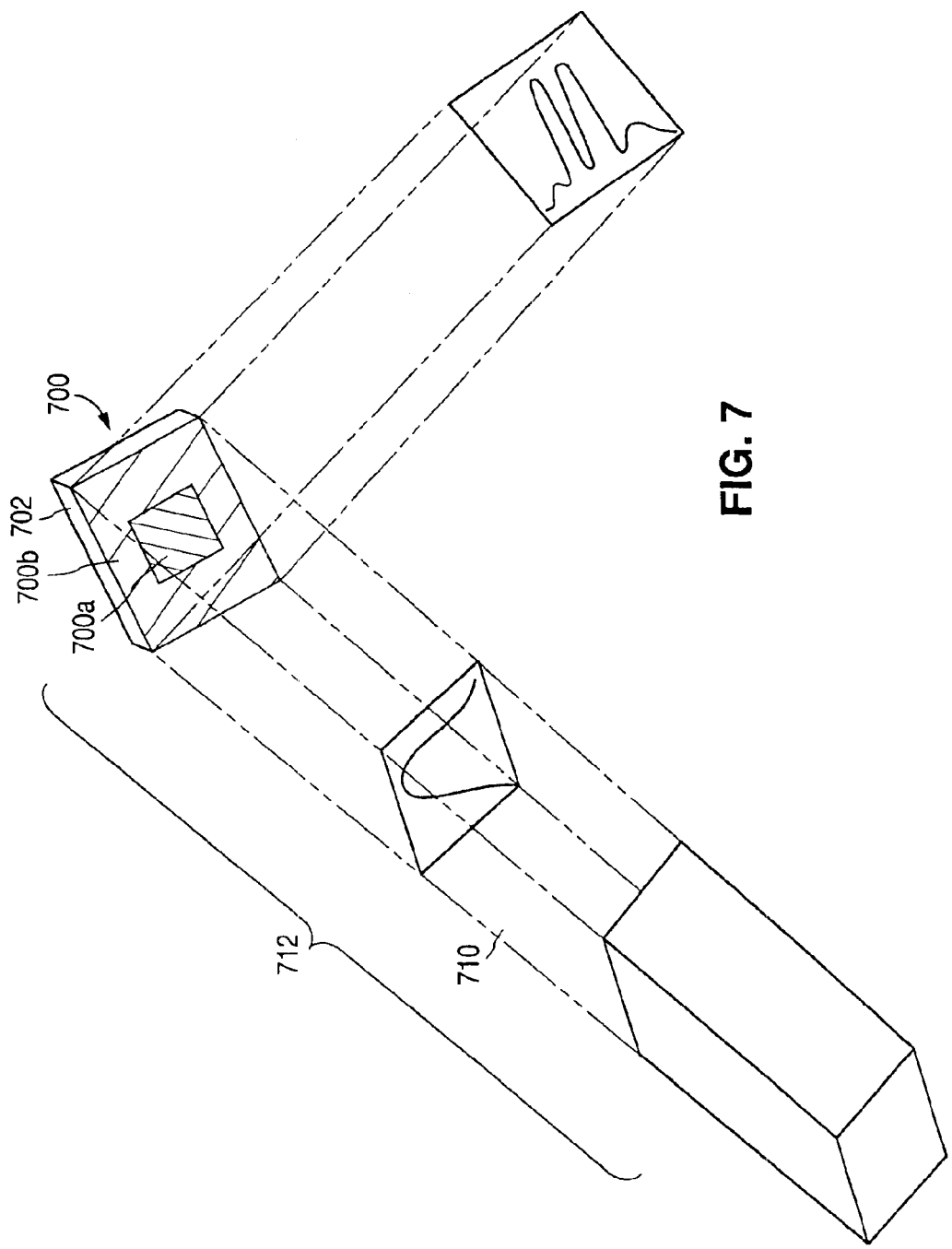
FIG. 7 shows a laser employing an anti-speckle apparatus in accordance with a fourth embodiment of the present invention.

Accordingly, FIG. 7 shows a fourth embodiment of an anti-speckle apparatus in accordance with the present invention. Reflective-type phase retarder plate 700 includes a reflective substrate 702 having a central coated region 700a surrounded by uncoated peripheral region 700b. As a result of the internal phase change in beam 710 caused by reflection by central coated region 700a and peripheral uncoated region 700b, the spatial coherence of laser beam 710 is disrupted and speckle is reduced. Reflective-type phase retarder plate 700 also serves as the outcoupling mirror for resonator 712.

In an alternative embodiment of the present invention, a holographic plate, rather than an optically coated plate of fused silica, is placed in the path of the laser beam. This holographic plate also causes an internal phase shift of the beam disrupting spatial coherence and preventing speckle. Such a holographic alternative embodiment could operate as either a transmission-type or reflective-type anti-speckle apparatus.

While the previously-discussed anti-speckle apparatuses reduce spatial coherence by causing an internal phase shift of the beam, this is not required by the present invention. An anti-speckle apparatus in accordance with alternative embodiments of the present invention could also disrupt spatial coherence of a laser beam through a scattering, rather than phase-shifting, mechanism.

Figure 8:
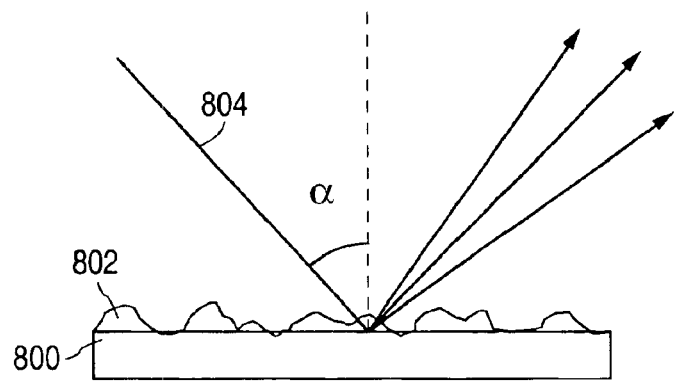
FIG. 8 shows an anti-speckle apparatus in accordance with a fifth embodiment of the present invention.
Figure 9:
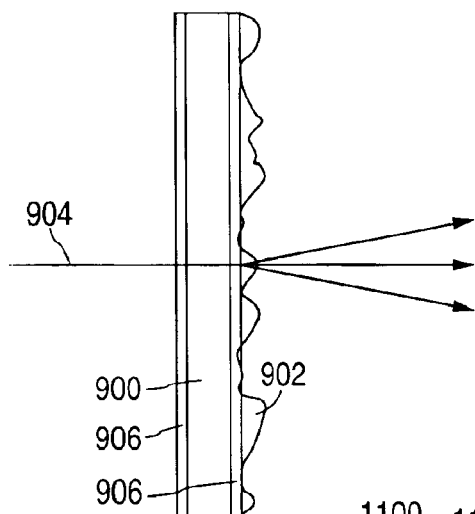
FIG. 9 shows an anti-speckle apparatus in accordance with a sixth embodiment of the present invention.

Accordingly, FIGS. 8 and 9 show anti-speckle apparatuses in accordance with fifth and sixth embodiments of the present invention which utilize a scattering mechanism to control spatial coherence. FIG. 8 shows a reflective-type anti-speckle device including scattering plate 800 bearing a roughened surface 802 which receives incident light 804 at an angle α. For ground surfaces, fluctuations in surface height may be assumed to be a Gaussian random process. Such a ground surface is characterized by a standard deviation in surface height ($\sigma_h$) and a correlation length ($\chi_c$).

The standard deviation in the light phase after reflection by such a ground surface is given by Equation 4:

$$\sigma_p = k(1+\cos\alpha)\sigma_h, \text{ where} \qquad (4)$$

$\sigma_p$=standard deviation in phase of reflected light;
$k=2\pi/\lambda$ ($\lambda$=wavelength of incident light);
$\alpha$=angle of incidence of light; and
$\sigma_h$=standard deviation of surface height.

The far field intensity distribution of the reflected light is given by Equation 5:

$$I(\theta) = I(0)e^{\left(\frac{-k^2 x_c^2 \sin^2\theta}{4\sigma_p^2}\right)}, \text{ where} \qquad (5)$$

$\theta$=angle of divergency; and
$I(0)$=far field intensity distribution of incident light.
Substituting Equation 4 into Equation 5 yields:

$$I(\theta) = I(0)e^{\left(\frac{-x_c^2 \sin^2\theta}{4(1+\cos\alpha)^2 \sigma_h^2}\right)}$$

The divergency of the laser beam after reflection from the scattering plate is:

$$\theta(1/e) = \frac{2(1+\cos\alpha)\sigma_h}{x_c} \qquad (6)$$

The correlation length $\chi_c$ is generally between about 5 μm and 80 μm. The standard deviation of surface height $\sigma_h$ is generally about 0.1 $\chi_c$. Therefore, in order to obtain a beam divergency angle (θ) in the range of 1–2 mrad, the quantity $\sigma_h/\chi_c$ must be a small value. One way of accomplishing this is to reduce the roughness of the surface by over-polishing. The correlation length $\chi_c$ will stay the same but the roughness $\sigma_h$ will be reduced.

FIG. 9 shows a transmissive type anti-speckle device including scattering plate 900 bearing a roughened surface 902 on the side of plate 900 facing away from incident light 904. Plate 900 is transparent to UV light and bears anti-reflective coating 906 on both sides.

The standard deviation in the light phase after transmission through such a plate is:

$$\sigma_p = k(n-1)\sigma_h, \text{ where:} \qquad (7)$$

$\sigma_p$=standard deviation in phase of reflected light;
$k=2\pi/\lambda$ ($\lambda$=wavelength of incident light);
n=refractive index of transmission material; and
$\sigma_h$=standard deviation of surface height.
Again, the far field intensity distribution of light is given by:

$$I(\theta) = I(0)e^{\left(\frac{-k^2 x_c^2 \sin^2\theta}{4\sigma_p^2}\right)} \qquad (5)$$

Substituting Equation 7 into Equation 5 yields:

$$I(\theta) = I(0)e^{\left(\frac{-x_c^2 \sin^2\theta}{4(n-1)^2 \sigma_h^2}\right)} \qquad (8)$$

The divergency of the laser beam after transmission through the scattering plate is:

$$\theta(1/e) = \frac{2(n-1)\sigma_h}{x_c} \qquad (9)$$

Again, the correlation length $\chi_c$ is generally between about 5 μm and 80 μm. The standard deviation of surface height $\sigma_h$ is generally about 0.1 $\chi_c$.

As with the reflective-type anti-speckle device shown in FIG. 8, in order to obtain a beam divergency in the range of 1–2 mrad, the quantity $\sigma_h/\chi_c$ must be a small value. This can be accomplished by additional grinding to reduce $\sigma_h$ relative to $\chi_c$.

Alternatively, the quantity $\sigma_h/\chi_c$ can be made small by placing the roughened surface of the transmissive-type scattering plate into contact with an index matching medium having a refractive index ($n_0$). The divergency of transmissive-type anti-speckle apparatus would then be given by:

$$\theta(1/e) = \frac{2(n-n_0)\sigma_n}{x_c}$$

The index matching medium must be a UV-transparent material having an appropriate refractive index. For purposes of selecting a matching medium, the table entitled "INDEX OF REFRACTION OF ORGANIC COM- POUNDS" at pages E-378 and E-379 of the 62$^{nd}$ Edition (1981–1982) of the Handbook of Chemistry and Physics, is hereby incorporated by reference.

Figure 10:
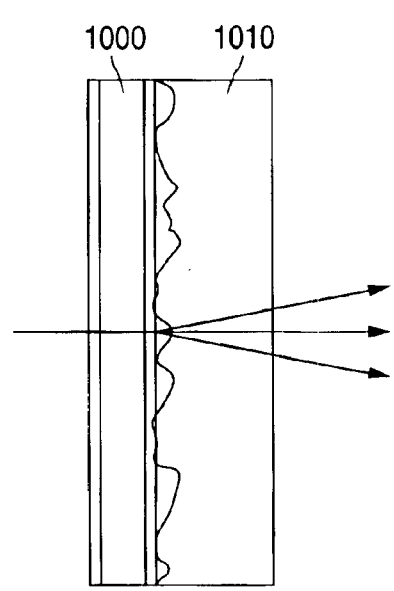
FIG. 10 shows an anti-speckle apparatus in accordance with a seventh embodiment of the present invention.

FIG. 10 shows one such transmissive-type anti-speckle device, wherein the index matching medium is solid coating 1010 overlying a UV-transparent scattering plate 1000. An example of suitable materials for this anti-speckle device would be a SUPRASIL® plate ($n_0$=1.508 @ $\lambda$=248 nm) bearing an SiO$_2$ coating ($n_0$=1.48).

Figure 11:
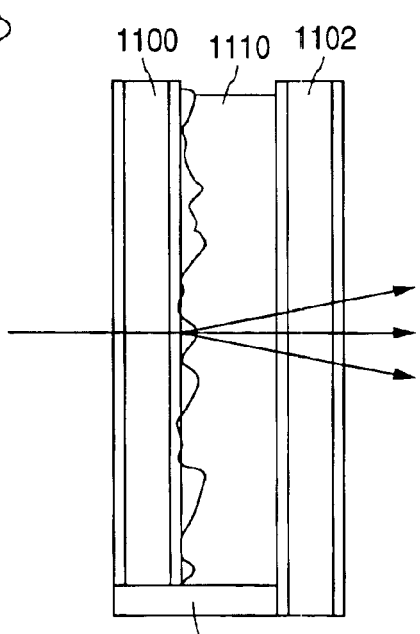
FIG. 11 shows an anti-speckle apparatus in accordance with an eighth embodiment of the present invention.

FIG. 11 shows an alternative transmissive-type anti-speckle device, wherein index matching medium 1110 is a liquid sandwiched between UV-transparent plates 1100 and 1102 separated by a spacer 1104. The use of such a structure including a matching liquid is disclosed in detail in German Patents DE 198 31 365A1 ("Light Guide With a Liquid Core"), and DE 198 32 277A ("UVC Liquid Light Guide"), hereby incorporated by reference.

Examples of materials useful for the embodiment of an anti-speckle apparatus as shown in FIG. 12 includes a SUPRASIL® plate ($n_0$=1.508 @ $\lambda$=248 nm) having a matching liquid 1.49<$n_0$<1.51.

With any of the embodiments shown above in FIGS. 8–11, the roughness of the scattering plate is selected to control the divergence and/or spatial coherence length of the laser beam. The correlation length and/or surface height of structures on the rough surface of the scattering plate are adjusted in accord with the selected divergence and spatial coherence. A ground surface may have its roughness reduced by overpolishing. A matching medium or overcoating may be placed in contact with the scattering surface to adjust the divergence and/or spatial coherence by adjusting the index of refraction at the interface with the scattering surface.

The embodiments of an anti-speckle device previously described feature phase retarder and scattering plates made from VUV-DUV transparent materials, with fused silica and SUPRASIL® given as examples. Other candidate VUV-DUV transparent materials include quartz glass, calcium fluoride, magnesium fluoride, lithium fluoride, and barium fluoride.

The following references contain information relevant to the present invention and are hereby incorporated by reference: "Spatial Coherence of KrF Excimer Lasers", S. Kawata et al., *Applied Optics* 31 (1992) 387; "Partially Coherent Sources Which Produce the Same Far-Field Intensity Distribution As A Laser", E. Wolf and E. Collett, *Optics Communications* 25 (1978) 293; and "Experimental Measurements of Non-Gaussian Scattering by a Fractal Diffuser", D. L. Jordan et al., *Applied Physics B* 31 (1983) 179.

Those skilled in the art will appreciate that the just-disclosed preferred embodiments are subject to numerous adaptations and modifications without departing from the scope and spirit of the invention. Therefore, it is to be understood that, within the scope and spirit of the invention, the invention may be practiced other than as specifically described above. The scope of the invention is thus not limited by the particular embodiments described above. Instead, the scope of the present invention is understood to be encompassed by the language of the claims that follow, and structural and functional equivalents thereof.

What is claimed is:

1. An apparatus for reducing speckle of a laser beam comprising a DUV-VUV transparent substrate configured to alter at least a first portion of the beam transmitted through at least a first region of the substrate relative to light transmitted outside of the first region of the substrate, such that the substrate generates a desired minimum number of spatially coherent cells in the laser beam.

2. The apparatus of claim 1, wherein the DUV-VUV transparent substrate includes a periodic phase shift optical coating over the first region, the phase shift optical coating causing a phase shift of light transmitted through the first region relative to light transmitted outside of the first region, such that the phase shift generates the desired minimum number of spatially coherent cells in the laser beam.

3. An apparatus according to claim 2, wherein the transparent substrate comprises at least one material selected from the group consisting of fused silica, quartz glass, calcium fluoride, magnesium fluoride, lithium fluoride, strontium fluoride, and barium fluoride.

4. An apparatus according to claim 2, wherein the optical coating comprises at least one material selected from the group of materials consisting of silicon dioxide and silicon nitride.

5. An apparatus according to claim 2, further comprising a fly eye lens.

6. An apparatus for reducing speckle of a laser beam comprising a DUV-VUV reflecting substrate configured to alter at least a first portion of the beam reflected from a first region of the substrate relative to light reflected from outside of the first region of the substrate, such that the substrate generates a desired minimum number of spatially coherent cells in the laser beam.

7. The apparatus of claim 6, wherein the DUV-VUV reflective substrate includes a periodic phase shift optical coating over the first region, the optical coating causing a phase shift of light reflected by the first region relative to light reflected outside of the first region, such that the phase shift generates the desired minimum number of spatially coherent cells in the laser beam.

8. An apparatus according to claim 7, wherein the reflective substrate comprises a shiny metallic layer.

9. An apparatus according to claim 7, wherein the phase shift optical coating comprises at least one material selected from the group consisting of silicon dioxide and silicon nitride.

10. An apparatus according to claim 7 wherein the coated reflective substrate is an outcoupling mirror of a laser resonator.

11. An apparatus according to claim 10, further comprising a fly eye lens after the reflective substrate.

12. An apparatus according to claim 7, further comprising a fly eye lens after the reflective substrate.

13. An apparatus according to claim 7 wherein the coated reflective substrate is positioned outside of a laser resonator.

14. The apparatus of claim 1, wherein the DUV-VUV transparent substrate includes a rough surface having a standard deviation in surface height and a correlation length, the rough surface causing scattering of light transmitted through the substrate to generate a desired minimum number of spatially coherent cells in the laser beam.

15. An apparatus according to claim 14, wherein the transparent substrate comprises at least one material selected from the group consisting of fused silica, quartz glass, calcium fluoride, magnesium fluoride, lithium fluoride, and barium fluoride.

16. An apparatus according to claim 14 wherein the rough surface is a ground surface.

17. An apparatus according to claim 16 wherein the rough surface is overpolished to adjust the standard deviation in surface height.

18. An apparatus according to claim 14 further comprising a matching medium in contact with the rough layer, a refractive index of the matching medium adjusting spatial coherence of the laser beam transmitted through the substrate.

19. An apparatus according to claim 18 wherein the matching medium is a solid.

20. An apparatus according to claim 18 wherein the matching medium is a liquid.

21. An apparatus according to claim 14 wherein the substrate bears an anti-reflective coating.

22. An apparatus according to claim 14, wherein said substrate is an outputcoupler of the laser system that produces the laser beam.

23. An apparatus according to claim 22, further comprising a fly eye lens after the substrate.

24. An apparatus according to claim 14, further comprising a fly eye lens after the substrate.

25. An apparatus of claim 6, wherein the DUV-VUV reflective substrate includes a rough surface having a standard deviation in surface height and a correlation length, the rough surface causing scattering of light reflected by the substrate to generate the desired minimum number of spatially coherent cells in the laser beam.

26. An apparatus according to claim 25 wherein the reflective substrate comprises a shiny metallic layer.

27. An apparatus according to claim 25 wherein the rough surface is a ground surface.

28. An apparatus according to claim 27 wherein the rough surface is overpolished to adjust the standard deviation in surface height.

29. An apparatus according to claim 25 wherein the reflective substrate is an outcoupling mirror of a laser resonator.

30. An apparatus according to claim 29, further comprising a fly eye lens after the substrate outcoupling mirror.

31. An apparatus according to claim 25 wherein the reflective substrate is positioned outside of a laser resonator.

32. An apparatus according to claim 31, further comprising a fly eye lens after the substrate.

* * * * *